United States Patent
Murali et al.

(10) Patent No.: US 8,344,774 B2
(45) Date of Patent: Jan. 1, 2013

(54) FREQUENCY SYNTHESIZER WITH IMMUNITY FROM OSCILLATOR PULLING

(75) Inventors: Sriram Murali, Bangalore (IN); Karthik Subburaj, Bangalore (IN); Neeraj Nayak, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/707,682

(22) Filed: Feb. 18, 2010

(65) Prior Publication Data

US 2010/0225367 A1 Sep. 9, 2010

Related U.S. Application Data

(60) Provisional application No. 61/158,117, filed on Mar. 6, 2009.

(51) Int. Cl.
*H03L 7/06* (2006.01)
(52) U.S. Cl. ......... 327/159; 327/147; 327/150; 327/156
(58) Field of Classification Search .................. 327/141, 327/144–163; 331/15–17, 331; 375/373–376
See application file for complete search history.

(56) References Cited

U.S. PATENT DOCUMENTS

| | | | |
|---|---|---|---|
| 2008/0106310 A1* | 5/2008 | Lai et al. | 327/158 |
| 2009/0140817 A1* | 6/2009 | Deng et al. | 331/17 |
| 2009/0147902 A1* | 6/2009 | Liu et al. | 375/376 |
| 2009/0274255 A1* | 11/2009 | Li | 375/376 |
| 2010/0073051 A1* | 3/2010 | Rao et al. | 327/157 |
| 2010/0310031 A1* | 12/2010 | Ballantyne et al. | 375/376 |

* cited by examiner

*Primary Examiner* — Lincoln Donovan
*Assistant Examiner* — Brandon S Cole
(74) *Attorney, Agent, or Firm* — Ron O. Neeringsl; Wade J. Brady, III; Frederick J. Telecky, Jr.

(57) ABSTRACT

Frequency synthesizer with immunity from oscillator pulling. The frequency synthesizer for generating an output frequency includes an oscillator that is capable of generating a first frequency. The frequency synthesizer also includes an output divider coupled to the oscillator. The output divider is configurable to allow the oscillator to generate a second frequency to prevent degradation in phase noise due to an interference to the first frequency of the oscillator, and to generate the output frequency from the second frequency.

10 Claims, 3 Drawing Sheets

US 8,344,774 B2

FREQUENCY SYNTHESIZER WITH IMMUNITY FROM OSCILLATOR PULLING

REFERENCE TO PRIORITY APPLICATION

This application claims priority from U.S. Provisional Application Ser. No. 61/158,117 filed Mar. 6, 2009, entitled "USE OF A PROGRAMMABLE OUTPUT DIVIDER IN FREQUENCY SYNTHESIZERS FOR IMMUNITY FROM OSCILLATOR PULLING", having same inventors and assigned to Texas Instrument Incorporated, which is incorporated herein by reference in their entirety.

TECHNICAL FIELD

Embodiments of the disclosure relate to a frequency synthesizer.

BACKGROUND

A transceiver, for example a radio transceiver, includes a frequency synthesizer. The frequency synthesizer generates multiple frequencies from an oscillator for processing multiple channels. The oscillator works based on a predefined frequency for each channel. Often, the transceiver includes various digital circuits operating at one or more clock frequencies. It might happen that a harmonic of the clock frequencies interferes with the predefined frequency associated with the oscillator at specific channels. The interference is referred to as oscillator pulling. The oscillator pulling worsens oscillator phase noise, and hence impacts processing of the channels and performance of the transceiver. Therefore, there is a need to minimize impact of the oscillator pulling.

In one existing technique, separate supply and ground pins are used for the digital circuits and the oscillator. In another existing technique, de-coupling capacitors are used to minimize effect of pulling. However, such techniques increase area of a chip. In some cases where area is a limitation such techniques cannot be used.

In yet another existing technique, the clock frequencies of the digital circuits that can cause the oscillator pulling are identified during design phase. The digital circuits are then designed to work at a plurality of clock frequencies so that any one clock frequency from the plurality of clock frequencies can be selected, based on the channel being tuned, to minimize interference with the oscillator. However, the technique fails for the clock frequencies that can cause the oscillator pulling but are not identified during the design phase. Further, changing of the clock frequency of the digital circuit from one frequency to another is limited and often may not be possible. For example, if a system-on-chip includes both a frequency modulation (FM) system and a Bluetooth system, and the harmonics of a clock frequency interfering with the FM system originates in the Bluetooth system, a frequency change might not be feasible.

SUMMARY

An example of a frequency synthesizer, for generating an output frequency, includes an oscillator that is capable of generating a first frequency. The frequency synthesizer also includes an output divider coupled to the oscillator. The output divider is configurable to allow the oscillator to generate a second frequency to prevent degradation in phase noise due to an interference to the first frequency of the oscillator, and to generate the output frequency from the second frequency.

An example of a method for generating an output frequency using a frequency synthesizer includes determining a division factor corresponding to an output divider and a frequency corresponding to an oscillator based on the output frequency and an aggressor frequency. The aggressor frequency is capable of causing interference in generation of the output frequency by the oscillator and the output divider. The method also includes causing the oscillator to generate the frequency. Further, the method includes causing the output divider to divide the frequency by the division factor to generate the output frequency without the interference.

An example of a method for enabling generation of an output frequency using a frequency synthesizer includes determining an aggressor frequency. The aggressor frequency is capable of causing interference in generation of the output frequency by an oscillator generating a first frequency and an output divider dividing the first frequency by a first division factor. The method also includes determining a second frequency corresponding to the oscillator and a second division factor corresponding to the output divider based on the aggressor frequency and the output frequency. Further, the method includes storing the second frequency and the second division factor, thereby enabling generation of the output frequency without the interference using the second frequency and the second division factor when desired.

BRIEF DESCRIPTION OF THE VIEWS OF DRAWINGS

In the accompanying figures, similar reference numerals may refer to identical or functionally similar elements. These reference numerals are used in the detailed description to illustrate various embodiments and to explain various aspects and advantages of the present disclosure.

DETAILED DESCRIPTION OF THE EMBODIMENTS

Figure 1:
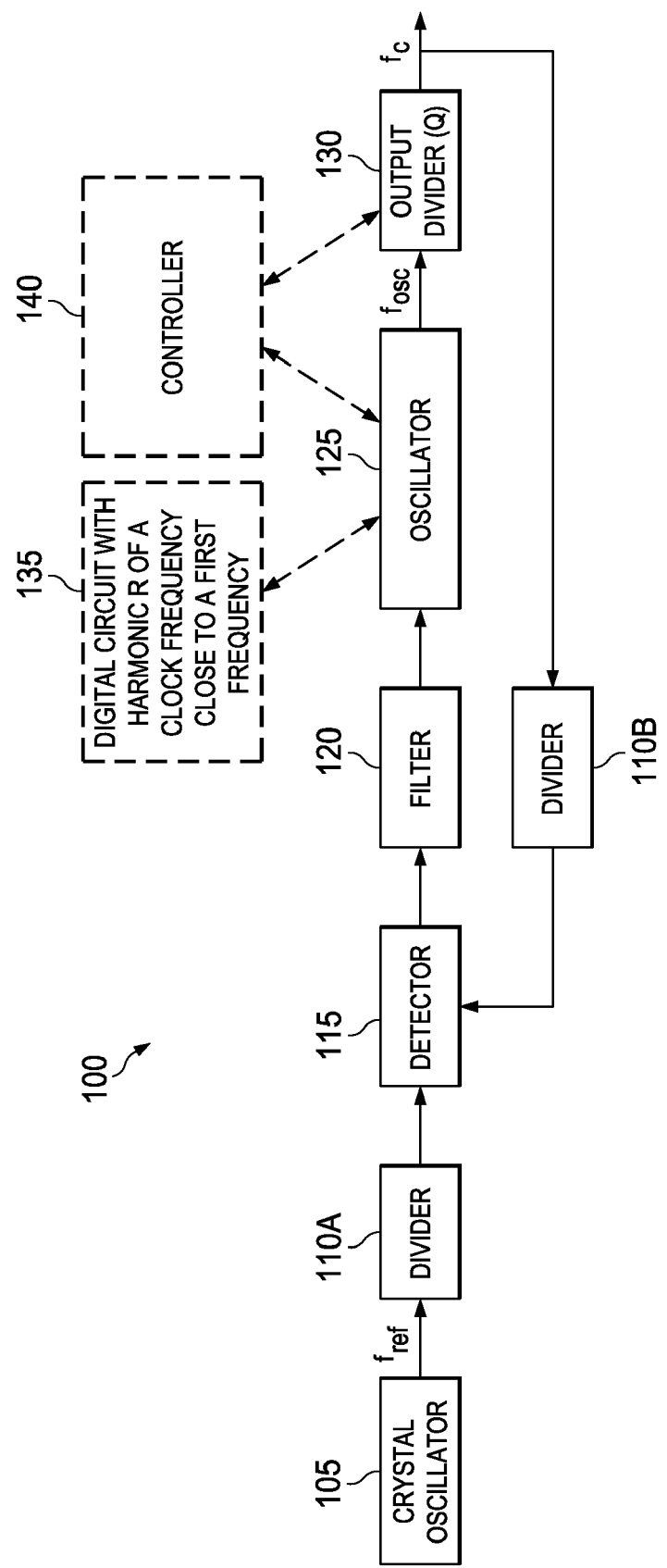
FIG. 1 illustrates a frequency synthesizer in accordance with one embodiment.

FIG. 1 illustrates a frequency synthesizer 100. The frequency synthesizer 100 includes a crystal oscillator 105. The frequency synthesizer 100 also includes a plurality of dividers, for example a divider 110A, a divider 110B and an output divider 130. The crystal oscillator 105 is coupled to the divider 110A. The divider 110A is coupled to a detector 115. The detector 115 is coupled to a filter 120. The filter 120 is coupled to an oscillator 125. The oscillator 125 is coupled to the output divider 130. The output divider 130 defines an output and is coupled to the divider 110B that in turn is coupled to the detector 115. The divider 110B, the detector 115 and the filter 120 forms a feedback loop for correcting a drift in an output frequency generated at the output defined by the output divider 130. In some embodiments, the output divider 130 and the oscillator 125 are coupled to a controller 140, for example a microcontroller, a microprocessor, digital circuit, or other hardware element.

The frequency synthesizer 100 generates multiple frequencies from the oscillator 125. Examples of the frequency synthesizer 100 include, but are not limited to, phase locked loop based frequency synthesizer and frequency locked loop based frequency synthesizer. Examples of systems including the frequency synthesizer 100 include, but are not limited to, radio frequency (RF) transceivers, radio transceivers, frequency modulation (FM) transceivers, multi-radio system-on-chips (SoCs), wireless local area network (WLAN) transceivers, Bluetooth transceivers, global positioning system (GPS) transceivers, non-radio systems, infrared transceivers, and satellite transceivers. The multi-radio transceivers can be referred to as a SoC including one or more combination of mentioned transceivers. Examples of the oscillator 125 include, but are not limited to, a voltage controlled oscillator. Examples of the detector 115 include, but are not limited to, a phase detector, a phase-frequency detector, a frequency comparator and a phase comparator.

The frequency synthesizer 100 generates multiple frequencies from the oscillator 125 corresponding to multiple channel frequencies. A channel frequency can also be referred to as an output frequency (fc). When the transceiver including the frequency synthesizer 100 has to receive or transmit a signal then the frequency synthesizer 100 is desired to generate the output frequency. The transceiver or any other SoC including the frequency synthesizer 100 also includes digital circuits for performing various functions and a harmonic (R) of a clock frequency of a digital circuit 135 may interfere with generation of the output frequency. The harmonic includes the clock frequency also. The clock frequency, causing interference, can be referred to as an aggressor frequency (fagg). The interference can cause pulling of the oscillator 125 and degrade phase noise. The phase noise is an indicator of stability of the oscillator 125. It is desired to generate the output frequency without the interference.

It is noted that there can be several aggressor frequencies corresponding to several digital circuits on the SoC. The techniques for preventing interference due to the aggressor frequencies are explained with help of one aggressor frequency.

The output divider 130 is a programmable divider and can be programmed to operate at several division factors for each output frequency. The oscillator 125 is capable of generating a first frequency from which the output frequency can be generated using a first division factor. In some embodiments, the interference due to the aggressor can cause interference to the first frequency. The output divider 130 is configurable to allow the oscillator 125 to generate a second frequency (fosc) to prevent degradation in phase noise due to the interference to the first frequency. The output divider 130 also generates the output frequency, without the interference, from the second frequency by dividing the second frequency with a second division factor (Q). The second division factor is different than the first division factor. The second frequency and the second division factor can be determined by checking a predefined criteria or checking a storage unit or a memory having a look-up table by the controller 140. The look-up table can either include a list of division factors for each channel that do not cause interference or can include a list of division factors that cause interference. The checking can be performed using a firmware program sequence or using hardware gate logic. The predefined criteria includes that the frequency should not be equal to any harmonic of the aggressor frequency, and that the frequency should not be in proximity of any harmonic of the aggressor frequency. The output divider 130 can be configured by the controller 140 based on the checking to operate based on the second division factor. The oscillator 125 can also be made to generate the second frequency by the controller 140.

In some embodiments, there might be a drift in the output frequency. The working of the frequency synthesizer 100 to correct the drift is explained as follows:

The crystal oscillator 105 generates a reference frequency ($f_{REF}$). The reference frequency is divided by a third division factor of the divider 110A to bring the reference frequency at a level desired for comparison with another frequency. The division is performed by the divider 110A. The output frequency which is also the channel frequency is also divided by the third division factor or another division factor, using the divider 110B, and provided to the detector 115. The detector 115 compares the reference frequency and value of the output frequency obtained after division, and generates an error signal, for example a voltage signal, proportional to the difference in frequency or phase between the reference frequency and the output frequency. The error signal represents an error or a drift in the output frequency. The filter 120 limits bandwidth of the error signal. The filter 120 also integrates the error signal to give an output. The oscillator 125 generates the second frequency based on the error signal. The detector 115 corrects the drift by generating the error signal that enables the oscillator 125 to generate the second frequency without the error. The second frequency is then divided by the second division factor to generate the output frequency without the error and without the interference.

It is noted that the divider 110B can be coupled to the oscillator 125 to receive the second frequency and to enable correction of the drift in the output frequency.

In some embodiments, the frequency generated by the oscillator 125 can be in Giga Hertz (GHz) range and the output frequency can be in Mega Hertz (MHz) range. For example, in case of the FM transceivers the output frequency can be in 76 MHz to 108 MHZ range, with a spacing of 50 Kilo Hertz (KHz) between each output frequency.

Figure 2:
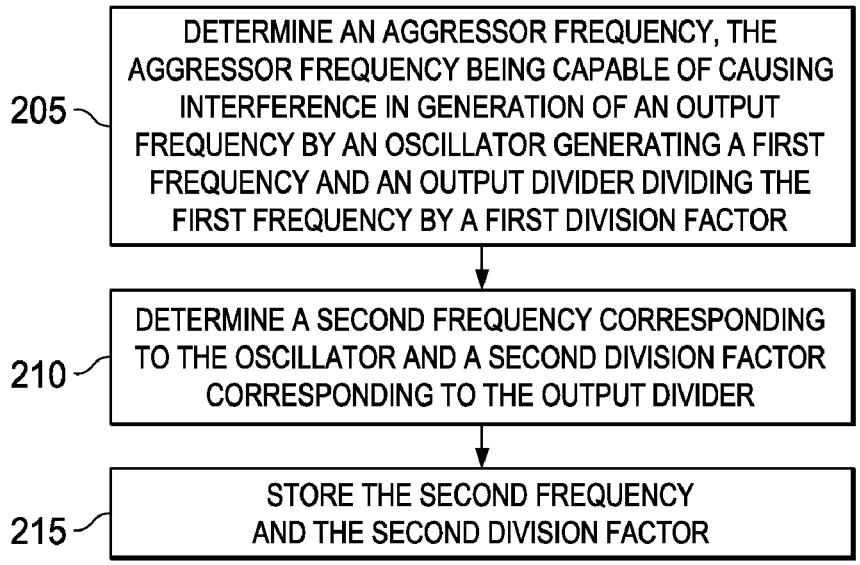
FIG. 2 is a flow diagram illustrating a method for enabling generation of an output frequency using a frequency synthesizer in accordance with one embodiment.

Referring to FIG. 2 now, at step 205 an aggressor frequency (fagg) corresponding to generation of an output frequency (fc) by the frequency synthesizer, for example the frequency synthesizer 100, is determined. The aggressor frequency can be referred to as a clock frequency, of a circuit present on a SoC including the frequency synthesizer, which is capable of causing an interference to generation of the output frequency. The aggressor frequency can cause the interference to a first frequency of an oscillator, for example the oscillator 125 if the oscillator is operated at the first frequency and hence, can cause interference to the generation of the output frequency as the output frequency is obtained from the first frequency by dividing the first frequency with a first division factor.

At step 210, a second frequency (fosc) corresponding to the oscillator and a second division factor (Q) corresponding to an output divider, for example the output divider 130, is determined. The second frequency and the second division factor are determined based on the aggressor frequency and the output frequency.

In one embodiment, the second division factor (Q) of the output divider is determined from the output frequency, the aggressor frequency (fagg) due to the circuit, and a harmonic (R) of the clock frequency or the aggressor frequency causing the interference. Several division factors can be determined using equation (1).

$$fc = \frac{fosc1}{Q1} = \frac{fosc2}{Q2} = \frac{foscn}{Qn} \quad (1)$$

where n=1, 2 . . . represents integers

The division factors determined using equation (1) are then checked against predefined criteria. The division factors that satisfy predefined criteria prevent interference and hence prevent pulling of the oscillator. The division factors that satisfy predefined criteria include the second division factor. The predefined criteria includes determining a pair (fc, Q) such that fc*Q is neither the harmonic nor in proximity of the harmonic of the aggressor frequency of the circuit.

In one embodiment, the determining of the pair (fc, Q) such that fc*Q is not a harmonic of the aggressor frequency of the circuit can be performed using equation (2).

In one example, the harmonic of the frequency causing the interference can be represented as in equation (2).

$$R = \left[\frac{fc \times Qn}{fagg}\right] \quad (2)$$

where n=1, 2 . . . represents integers, and Qn corresponds to division factors considered to generate the output frequency fc.

If the value of R is an integer then corresponding division factor, for example Q14 corresponding to n=14, is considered to be bad as corresponding oscillator frequency, fosc14 corresponding to n=14, is prone to the interference.

Also, if the value of R is close to an integer then corresponding division factor, for example Q14 corresponding to n=14, is considered to be bad as corresponding oscillator frequency, fosc14 corresponding to n=14, is prone to interference. The value of R being close to an integer is indicative of the proximity to the harmonic. The proximity can be varied based on various application areas. For example, when decimal factor in R is either less than or equal to 0.1, or greater than or equal to 0.9 then R can be considered as the harmonic. 14.00 to 14.10 and 14.90 to 15.00 can be considered as harmonic.

In some embodiments, a relative measure can be considered for determining the division factor as bad or good. For example, if Q1 yields an R1=13.85 and Q2 yields an R2=14.7 then the division factor corresponding to R1 can be considered as relatively more bad or relatively less good as compared to R2, as R1 is relatively more closer to an integer values as compared to R2. In another aspect, preference should be given to R2 over R1.

If the value of R is neither close nor in proximity to an integer then corresponding division factor, for example Q13 corresponding to n=13, is considered to be good as corresponding oscillator frequency, fosc13 corresponding to n=13, is free from the interference.

In another embodiment, the determining of the pair (fc, Q) such that fc*Q is not a harmonic of the aggressor frequency of the circuit can be performed using equation (3) and equation (4).

$$R = \text{round}\left[\frac{fc \times Qn}{fagg}\right] \quad (3)$$

where n=1, 2 . . . represents integers, Qn corresponds to division factors considered to generate the output frequency fc, and round corresponds to rounding function.

A check as illustrated in equation (4) is performed for each division factor (Qn).

$$\left(\frac{fagg \times R}{Qn} - \Delta f\right) \le fc \le \left(\frac{fagg \times R}{Qn} + \Delta f\right) \quad (4)$$

where $\Delta f$ represents a band of frequencies around fc and can be a multiple of spacing between channels.

If equation (4) is satisfied then Qn is considered bad as the predefined criteria is not satisfied, else, Qn is considered good. The $\Delta f$ can be varied.

A firmware program sequence or hardware gate logic can be used to check the predefined criteria.

Various permissible values of division factors for a channel can be considered for checking against the predefined criteria. The values of division factors that satisfy the predefined criteria are then stored in a look-up table for the channel at step 215. Values of division factors satisfying the predefined criteria can be different for different channels. Values for various channels can be stored in the look-up table.

In some embodiments, values of division factors that does not satisfy the predefined criteria can be stored instead of the values satisfying the predefined criteria. The decision can be made based on optimization of storing unit. For example, if the number of division factors that does not satisfy the predefined criteria is less than the number of division factors that satisfy the predefined criteria then values of division factors that does not satisfy the predefined criteria can be stored.

Storing enables generation of the output frequency without the interference using the second frequency and the second division factor when desired. In one example, when a transceiver including the frequency synthesizer has to receive or transmit a signal then it can be desired to generate the output frequency using the frequency synthesizer.

Step 205 through step 215 can be performed offline, using silicon samples.

Figure 3:
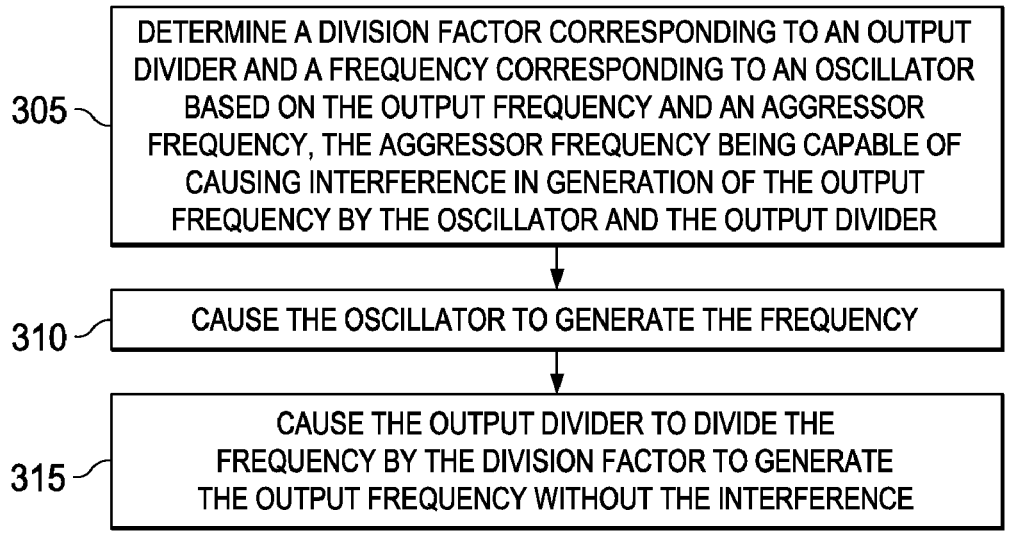
FIG. 3 is a flow diagram illustrating a method for generating an output frequency using a frequency synthesizer in accordance with one embodiment.

Referring to FIG. 3 now, at step 305 a division factor (the second division factor) corresponding to an output divider, for example the output divider 130, and a frequency (the second frequency) corresponding to an oscillator, for example the oscillator 125, is determined based on an output frequency and an aggressor frequency. The aggressor frequency is capable of causing interference in generation of the output frequency by the oscillator and the output divider.

In one embodiment, the division factor can be determined by checking a look-up table and the frequency can be determined based on the division factor. The look-up table can either include one or more division factors that can cause interference in generation of the output frequency by the oscillator and the output divider for each channel or the look-up table can include one or more division factors that do not cause interference in generation of the output frequency by the oscillator and the output divider for each channel.

In another embodiment, the division factor and the frequency can be determined by checking a predefined criteria. The checking can include determining the frequency that is not equal to an harmonic of the aggressor frequency or determining the frequency that is not in proximity of the harmonic of the aggressor frequency. Various techniques, for example equation (2), or equation (3) and (4) can be used for checking. A firmware program sequence or hardware gate logic can be used to check the predefined criteria.

In some embodiments, the value of n corresponding to a maximum permissible value of Qn for the channel can be considered for checking against the predefined criteria or checking in the look-up table. The subsequent values of Qn can then be considered in decreasing order. The maximum permissible value can be considered, as higher the value of Qn better is the phase noise. In one example, the maximum permissible value for each channel can be determined based on various factors, for example range of output frequencies, range of operating frequencies of the oscillator, and application area.

At step 310, generation of the frequency by the oscillator is caused. At step 315, division of the frequency by the division factor corresponding to the output divider is caused to generate the output frequency without the interference. A controller, for example the controller 140 coupled to the output divider and the oscillator can cause the oscillator to generate the frequency and the output divider to perform the division by programming control registers associated with the oscillator.

Figure 4A:
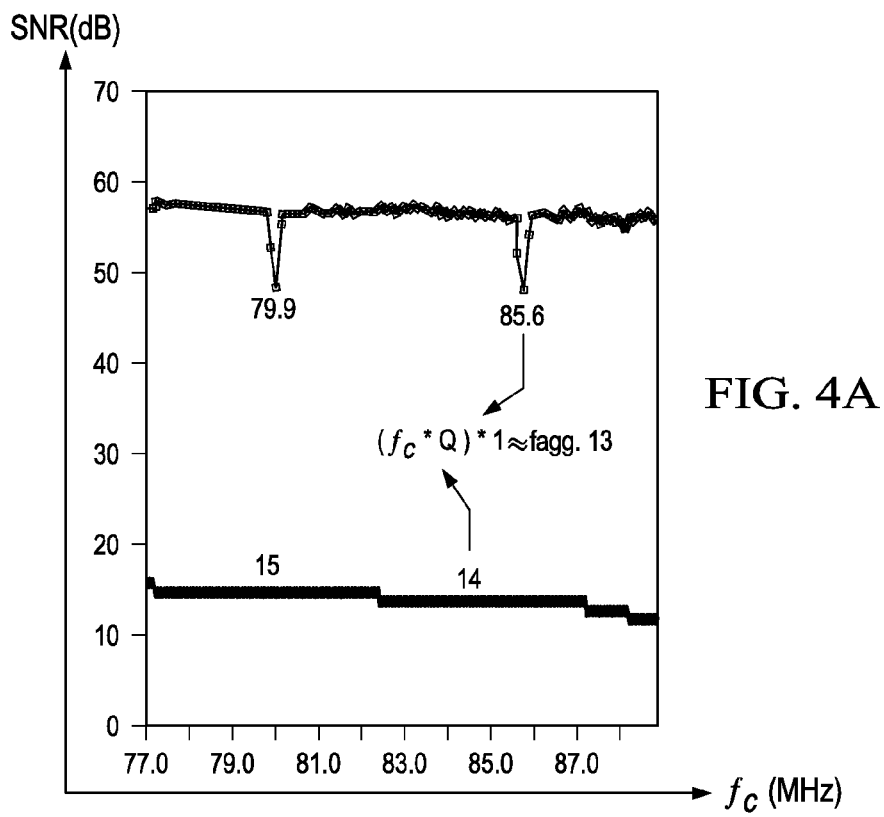
FIGS. 4A and 4B are graphical representations of signal-to-noise ratio verses frequencies in accordance with one embodiment.
Figure 4B:
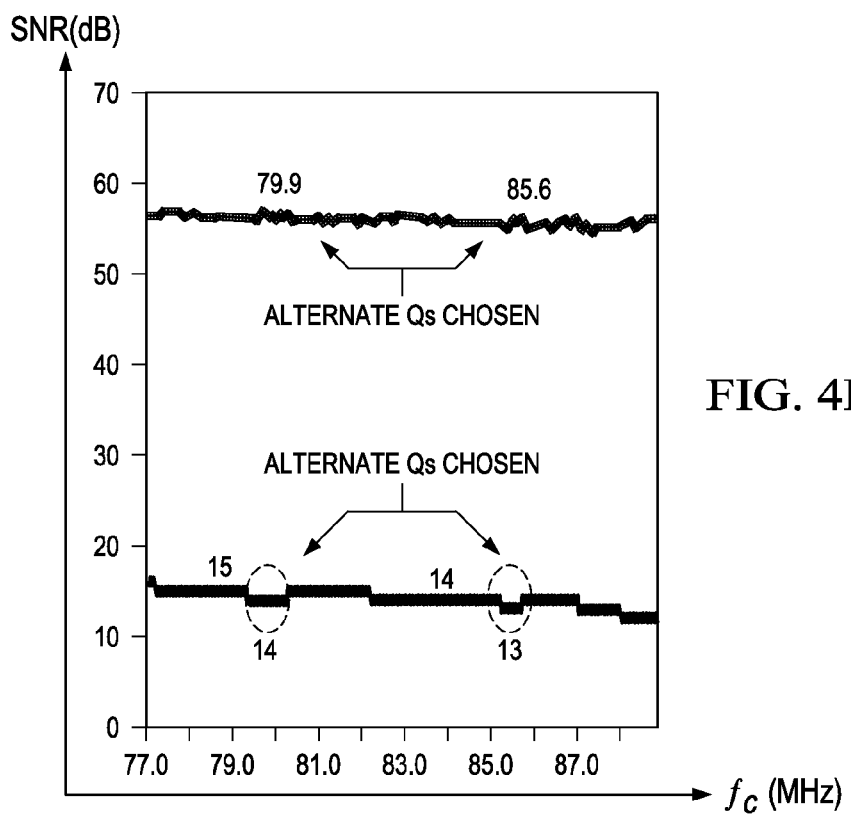

The method described in FIG. 2 and FIG. 3 is explained with help of an example in FIG. 4A and FIG. 4B.

FIGS. 4A and 4B are graphical representations of signal-to-noise ratio (SNR) verses frequencies of channels. FIG. 4A indicates impact of pulling of an oscillator of a frequency synthesizer and FIG. 4B indicates generation of output frequencies by the frequency synthesizer having immunity from the pulling.

The graphical representations correspond to a 65 nm multi-radio SoC supporting the FM transceiver, Bluetooth transceiver and WLAN transceiver. The multi-radio SoC includes the frequency synthesizer having immunity from the pulling. The oscillator of the frequency synthesizer operates in GHz range. The frequencies of the channels for FM includes 76 MHz to 108 MHz, with a spacing of 50 KHz between each channel. An interference is determined to the first frequency of the oscillator for processing the channels having frequency as 79.9 MHz and 85.6 MHz, respectively. A clock frequency or aggressor frequency (fagg) corresponding to the interference for the channel with frequency 85.6 MHz is 92.16 MHz. The values of Qn can then be determined as $$85.6 = fc = \frac{foscn}{Qn} = \frac{1284}{15} = \frac{1198.4}{14} = \frac{1112.8}{13} = \dots$$

In illustrated example, the value of Qn when 14 is subject to interference as shown in FIG. 3A. The equations (3) and (4) corresponding to Qn=14 are illustrated below. The R is:

$$R = \text{round}\left(\frac{85.6 \times 14}{92.16}\right) = \text{round}(13.0034 \dots) = 13$$

$$\left(\frac{92.16 \times 13}{14} - .2\right) \le 85.6 \le \left(\frac{92.16 \times 13}{14} + .2\right) \Rightarrow 85.377 \le 85.6 \le 85.777$$

The value of Qn equal to 14 satisfy the equation (4) and hence does not satisfy the predefined criteria and thus the interference, caused due to the 13$^{th}$ harmonic of the aggressor frequency (92.16 MHz), causes pulling of the oscillator of the frequency synthesizer. The pulling leads to a drop in SNR of the transceiver at channel of frequency 85.6 MHz, as shown in FIG. 3A. "0.2" corresponds to Δf. In the illustrated example, Δf is selected as 50 KHz*4=0.2 MHz to cover 4 channels.

Varying value of Δf provides flexibility to detect the interference for a band of channel frequencies rather than one channel frequency.

Referring now to FIG. 3B, a value of Qn equal to 13 is chosen to prevent pulling. The equations corresponding to Qn=13 is $$R = \text{round}\left(\frac{85.6 \times 13}{92.16}\right) = \text{round}(12.0746 \dots) = 12$$

$$\left(\frac{92.16 \times 12}{13} - .2\right) \le 85.6 \le \left(\frac{92.16 \times 12}{13} + .2\right) \Rightarrow 84.87 \le 85.6 \ge 85.27$$

The Qn=13 does not satisfy equation (4) as illustrated above and hence, satisfies the predefined criteria. The Qn=13 is determined as the division factor (Q) which provides immunity to the frequency synthesizer from pulling as shown in FIG. 3B.

Similar steps are performed for the channel having frequency as 79.9. A division factor (=14) is chosen to avoid pulling as shown in FIG. 3B.

In the foregoing discussion, the term "coupled" refers to either a direct electrical connection between the devices connected or an indirect connection through one or more passive or active intermediary devices. The term "circuit" means at least either a single component or a multiplicity of components, either active or passive, that are connected together to provide a desired function. The term "signal" means at least one current, voltage, charge, data, or other signal.

Those skilled in the art will recognize that a wide variety of modifications, alterations, and combinations can be made with respect to the above described embodiments without departing from the scope of the present disclosure, and that such modifications, alterations, and combinations are to be viewed as being within the ambit of the present disclosure.

What is claimed is:

1. A frequency synthesizer for generating an output frequency, the frequency synthesizer comprising:
   an oscillator that is capable of generating a first frequency; and
   an output divider coupled to the oscillator and to a controller, the output divider being configurable to allow the oscillator to generate a second frequency to prevent degradation in phase noise due to an interference to the first frequency of the oscillator, and to generate the output frequency from the second frequency, wherein the controller configures the output divider by determining a division factor corresponding to the output divider and the second frequency corresponding to the oscillator based on the output frequency and an aggressor frequency, the aggressor frequency being capable of causing interference to the first frequency; and
   a memory having a look-up table coupled to the controller, wherein the look-up table comprises one or more division factors relating to interference in generation of the output frequency by the oscillator and the output divider, wherein the controller selects the division factor from the one or more division factors.

2. The frequency synthesizer as claimed in claim 1, wherein the frequency synthesizer is at least one of:
   a phase-locked loop based frequency synthesizer; and
   a frequency-locked loop based frequency synthesizer.

3. The frequency synthesizer as claimed in claim 1, wherein the frequency synthesizer is comprised in one of:
   a radio frequency transceiver;
   a global positioning system transceiver;

a wireless local area network transceiver;
infrared transceivers;
non-radio systems; and
multi-radio transceivers.

4. The frequency synthesizer as claimed in claim 1 and further comprising:
a divider coupled to the output divider;
a detector coupled to the divider that corrects a drift in the output frequency; and
a filter coupled between the detector and the oscillator.

5. A method for generating an output frequency using a frequency synthesizer, the method comprising:
determining a division factor corresponding to an output divider and a frequency corresponding to an oscillator based on the output frequency and an aggressor frequency, the aggressor frequency being capable of causing interference in generation of the output frequency by the oscillator and the output divider;
causing the oscillator to generate the frequency; and
causing the output divider to divide the frequency by the division factor to generate the output frequency without the interference.

6. The method as claimed in claim 5, wherein determining the division factor corresponding to the output divider and the frequency corresponding to the oscillator comprises:
checking a look-up table, the look-up table comprising one or more division factors that cause interference in generation of the output frequency by the oscillator and the output divider, and avoiding such division factors.

7. The method as claimed in claim 5, wherein determining the division factor corresponding to the output divider and the frequency corresponding to the oscillator comprises:
checking a look-up table, the look-up table comprising one or more division factors that do not cause interference in generation of the output frequency by the oscillator and the output divider, and selecting one of the one or more division factors.

8. The method as claimed in claim 5, wherein determining the division factor corresponding to the output divider and the frequency corresponding to the oscillator comprises:
determining the frequency not equal to an harmonic of the aggressor frequency; and
determining the frequency not in proximity of the harmonic of the aggressor frequency.

9. A method for enabling generation of an output frequency using a frequency synthesizer, the method comprising:
determining an aggressor frequency, the aggressor frequency being capable of causing interference in generation of the output frequency by an oscillator generating a first frequency and an output divider dividing the first frequency by a first division factor;
determining a second frequency corresponding to the oscillator and a second division factor corresponding to the output divider based on the aggressor frequency and the output frequency; and
storing the second frequency and the second division factor, thereby enabling generation of the output frequency without the interference using the second frequency and the second division factor when desired.

10. The method as claimed in claim 9, wherein determining the aggressor frequency comprises:
determining a clock frequency having an harmonic equal to the first frequency, the clock frequency corresponding to a digital circuit present in a system-on-chip, the system-on-chip comprising the frequency synthesizer; and
determining the clock frequency having the harmonic in proximity of the first frequency.

* * * * *